United States Patent
Yoshimura

(10) Patent No.: US 6,383,940 B1
(45) Date of Patent: May 7, 2002

(54) EXPOSURE METHOD AND APPARATUS

(75) Inventor: Keiji Yoshimura, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/342,540

(22) Filed: Jun. 29, 1999

(30) Foreign Application Priority Data

Jul. 2, 1998 (JP) .......................................... 10-201094

(51) Int. Cl.$^7$ ...................... H01L 21/302; H01L 21/461
(52) U.S. Cl. ........................... 438/708; 438/504; 355/52
(58) Field of Search .................................. 438/210, 688, 438/707, 708, 494, 504, 694, 767, 944; 355/51, 52, 53, 67, 71, 97; 382/145, 151, 309

(56) References Cited

U.S. PATENT DOCUMENTS

| | | | |
|---|---|---|---|
| 5,617,182 A | * 4/1997 | Wakamoto et al. ............ | 355/53 |
| 5,815,594 A | * 9/1998 | Tanaka ........................ | 382/151 |
| 5,914,773 A | 6/1999 | Kurosawa et al. ............. | 355/53 |
| 5,933,219 A | 8/1999 | Unno ........................... | 355/71 |
| 6,078,380 A | * 6/2000 | Taniguchi et al. ............. | 355/52 |

* cited by examiner

Primary Examiner—David Nelms
Assistant Examiner—Phuc T. Dang
(74) Attorney, Agent, or Firm—Fitzpatrick, Cella, Harper & Scinto

(57) ABSTRACT

A method of exposing a substrate to a pattern of a reticle by synchronously scanning the reticle and the substrate in a direction relative to a slit-shaped illumination area which is formed on the reticle. The method includes steps of providing a reticle on which first and second patterns are formed along the direction, with a space therebetween, exposing a substrate to the first and second patterns of the reticle under different exposure conditions in one scanning process and changing over the exposure conditions when the illumination area exists in the space on the reticle during the one scanning process.

22 Claims, 9 Drawing Sheets

EXPOSURE METHOD AND APPARATUS

BACKGROUND OF THE INVENTION

This invention relates to an exposure method and apparatus and, more particularly, to an exposure method and apparatus for exposing a substrate to a fine circuit pattern. An exposure method and apparatus of this kind find use in the manufacture of semiconductor chips such as IC and LSI chips and various devices such as display elements used in liquid crystal panels and the like, detection elements used in magnetic heads and the like, and image sensing elements such as CCDS.

When an IC or LSI chip or a device such as a liquid crystal panel is manufactured using photolithography, the projection exposure apparatus currently used most generally employs an excimer laser as the light source. However, with a projection exposure apparatus using an excimer laser as the light source, it is difficult to form a fine pattern having a line width of less than 0.15 $\mu$m.

In theory, the NA (numerical aperture) of the projection optical system should be enlarged or the wavelength of the exposing light reduced in order to raise the resolution of the exposure apparatus. However, this is not easy to achieve. Specifically, since the depth of field of the projection optical system is inversely proportional to the square of the NA and proportional to the wavelength $\lambda$, enlarging the NA of the projection optical system diminishes the depth of field, makes focusing difficult and lowers productivity. Further, the transmittance of most glass materials is extremely low in the far ultraviolet region. For example, at wavelengths of less than 193 nm, transmittance falls to almost zero even in the case of fused quartz, which is used at a wavelength of 248 nm (in a KrF excimer laser). At present, there is not a glass material available that can be used practically in a region of exposure wavelengths of less than 150 nm, which corresponds to a fine pattern having a line width of less than 0.15 $\mu$m obtained by ordinary exposure.

There has been proposed an exposure method of higher resolution obtained by subjecting a substrate to double exposure, namely to two-beam interference exposure and ordinary exposure, and applying a multivalued exposure distribution to the substrate at this time. In accordance with this method, a pattern with a minimum line width of 0.10 $\mu$m can be formed using a projection exposure apparatus having an exposure wavelength of 248 nm (using a KrF excimer laser) and an NA of 0.6 on the image side of the projection optical system.

According to the exposure method mentioned above, two-beam interference exposure is performed by exposure with so-called coherent illumination using an L & S (line and space) phase-shift mask (or reticle) having a line width of 0.1 $\mu$m, after which ordinary exposure (e.g., exposure by partially coherent illumination) is carried out using a mask (or reticle) formed to have a real element pattern of a minimum line width of 0.1 $\mu$m. Thus, with the double-exposure method, two exposure steps involving different exposure information are required for each shot in order to form one pattern. A problem that arises is reduced throughput.

SUMMARY OF THE INVENTION

An object of the present invention is to raise the throughput of a multiple-exposure method in which one type of pattern is formed by superimposing and printing patterns of a plurality of types on the same shot of a substrate to be exposed.

A substrate to be exposed is exposed to the pattern image of a reticle by synchronizing the reticle and the substrate and scanning them relative to a slit-shaped beam while part of the pattern image of the reticle is illuminated in the shape of the slit and projected upon the substrate. In order to attain the object set forth above, the present invention is such that a plurality of patterns are formed on the reticle beforehand so as to be arrayed in the scanning direction, and illuminating conditions or focus target values are changed over at vacant spaces between patterns during scanning exposure.

In accordance with the present invention, patterns of a plurality of types are formed on a single reticle and a substrate is exposed to these patterns by a single scan in the direction in which the patterns are arrayed. The result is higher throughput. Since the exposure conditions are changed over at the vacant spaces between patterns, exposure performance is improved.

In a preferred embodiment of the present invention, the wavelength of the exposing light and projection magnification of the pattern images are changed in conformity with the focus target value. Further, the vacant space between the patterns on the reticle are made broader than an ordinary scribe line to afford a greater temporal margin for the changeover. Furthermore, by partially overlapping scanning exposure zones and repeating exposure, the plurality of patterns are projected onto the same exposure position of the substrate in a superimposed form to thereby expose the substrate at this position.

The changeover of illumination conditions is performed by providing a plurality of illumination systems in which light beams, which have been obtained by splitting a beam emitted from a single exposure light source, are set to respective ones of desired illumination conditions, and illuminating each pattern by the respective illumination system. In other words, if a pattern illuminated by a slit is changed over, the illumination conditions also change over automatically. As a result, it is possible to prevent a decline in throughput brought about by changing over the illumination conditions of an illumination system in dependence upon the pattern. Throughput can thus be raised.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENT

Figure 1:
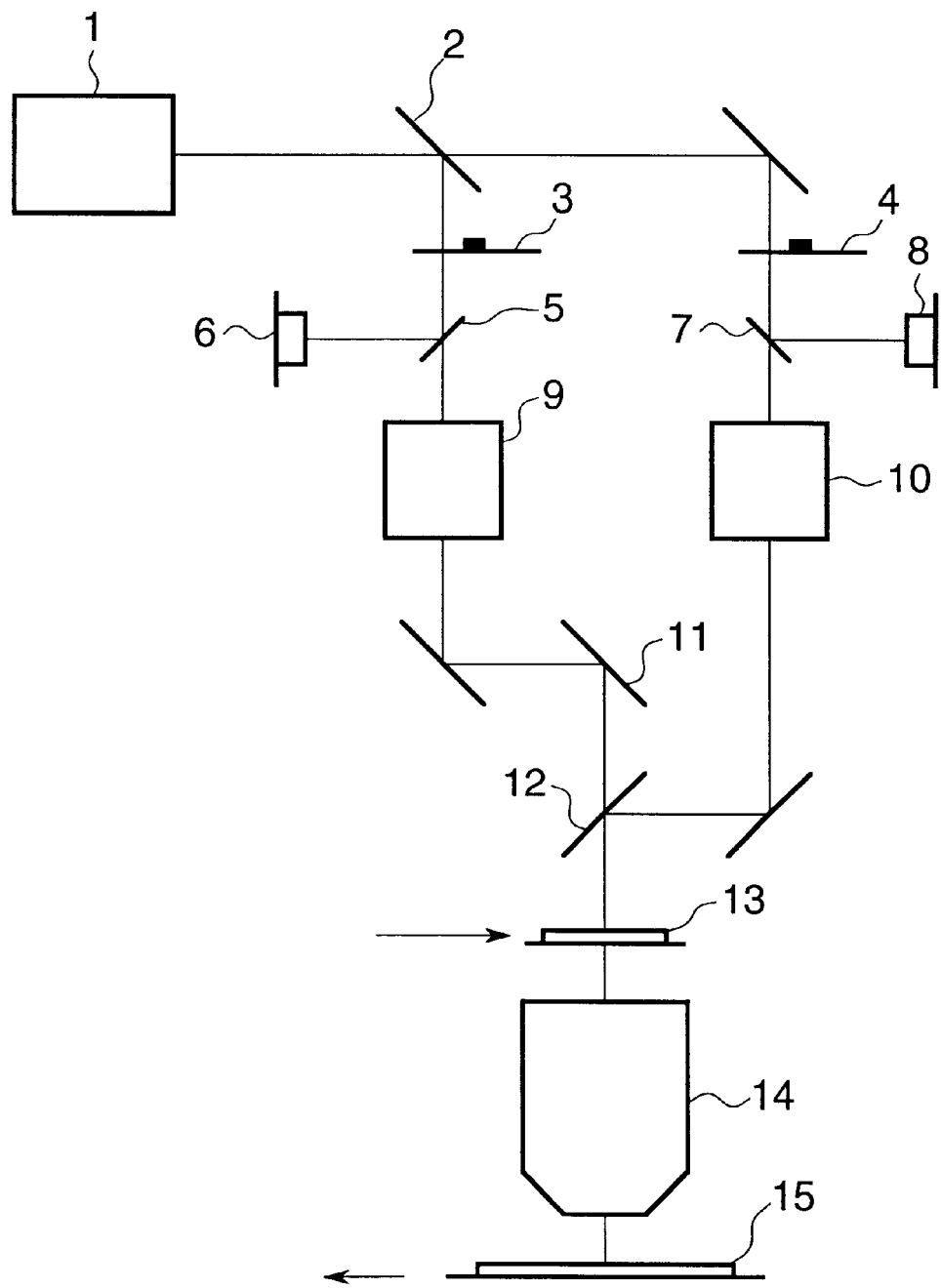
FIG. 1 is a diagram showing the construction of a scanning-type multiple-exposure apparatus according to an embodiment of the present invention.

A method of simultaneously printing a plurality of patterns is desired in order to raise throughput at the time of multiple exposure for forming one type of pattern by superimposed printing of patterns of a plurality of types on the same shot of a substrate to be exposed. It is necessary at such a time to employ a printing technique that requires few reticle alignments, wherein use is made of a single reticle having the aforesaid plurality of patterns.

However, in a case wherein a pattern (referred to as an "F pattern" below) such as the above-mentioned phase-shift mask and a pattern (referred to as an "R pattern" below) such as a real element pattern are formed on a single mask (or reticle) and exposed to light, illumination conditions such as σ and an amount of exposure are not the same for the F and R patterns. In addition, since exposure of the phase shift mask (F pattern) is carried out using light that passes through the peripheral portion of a projection lens, focus and tilt deviate relative to those of the R-pattern exposure owing to the influence of aberration.

Further, in a case wherein a fine pattern having a minimum line width of 0.1 μm is transferred to a wafer by double exposure of an L & S (line and space) Levinson pattern (F pattern) having a line width of 0.1 μm and a real-element pattern (R pattern) having a minimum line width of 0.1 μm, it has been confirmed by experimentation that the illumination conditions of the F pattern are such that the optimum σ is 0.3 to 0.2, while the illumination conditions of the R pattern are such that the optimum σ is 0.6 to 0.8, indicating that the optimum amount of exposure for the R pattern is two to three times that for the F pattern.

Thus, when patterns differ, so do the focus and exposure conditions. Consequently, when ordinary scanning exposure for which there is one focus and one target amount of exposure is carried out using a reticle of the type in which a single reticle has F and R patterns, the best exposure performance cannot be achieved owing to a difference in focus and a difference in amounts of exposure ascribed to the difference in patterns.

Accordingly, in a preferred embodiment of the present invention, the exposure apparatus comprises a single light source, one or a plurality of illumination systems, a reticle and a projection lens, and multiple scanning exposure is carried out using a single reticle having an F pattern and an R pattern. By changing over the wavelength of the light source or altering the z (focus and tilt) target values between the area of the F pattern and the area of the R pattern, the effects of a difference in focus due to a difference in reticles are eliminated. Furthermore, light source illuminance and the illumination system are changed over to eliminate a disparity in the quantity of light.

In a case wherein multiple exposure is thus performed using a single reticle having two types of patterns, namely the F pattern and the R pattern, the precision of multiple exposure can be improved by taking into consideration a change in F-pattern and R-pattern focus and a change in exposure target value.

More specifically, after the above-mentioned reticle is placed on a reticle stage and a correction applied in the traveling direction, an error between the F and R patterns and the x, y and θ components are calculated from pattern-difference detection marks, which are for detecting the difference between the F and R patterns, provided in the F and R patterns (or at portions in the proximity of the patterns). The calculated values are then stored.

Ordinarily, printing is performed after a compensation is made for the relative relationship between the reticle and reticle stage by marks provided at common portions of the reticle. The F pattern portion and the R pattern portion are printed by a single scan. When printing is carried out, stepping is performed in such a manner that the F and R pattern portions will overlap, then the F and R pattern portions are printed in this superimposed state. The patterns differ at the F and R pattern portions and, therefore, the optimum amounts of exposure and optimum focus values differ at such time. Accordingly, the F pattern portion and the R pattern portion are separately provided with optimum amounts of exposure and optimum amounts of focus, and the target values are changed over at the boundary between the F and R pattern portions. Furthermore, a shift in the F and R pattern portions is reflected in the target scanning conditions, thereby assuring precision of overlay between the F and R patterns.

As for the focus target values, two methods are available for changeover, namely a method of changing over the z-stage target value of the wafer at a vacant space between the F pattern and the R pattern, and a method of changing over the wavelength of the light source. If the wavelength is changed over, magnification at the wafer surface changes and it is necessary, therefore, to suitably adjust the magnification of the projection lens.

Figure 5:
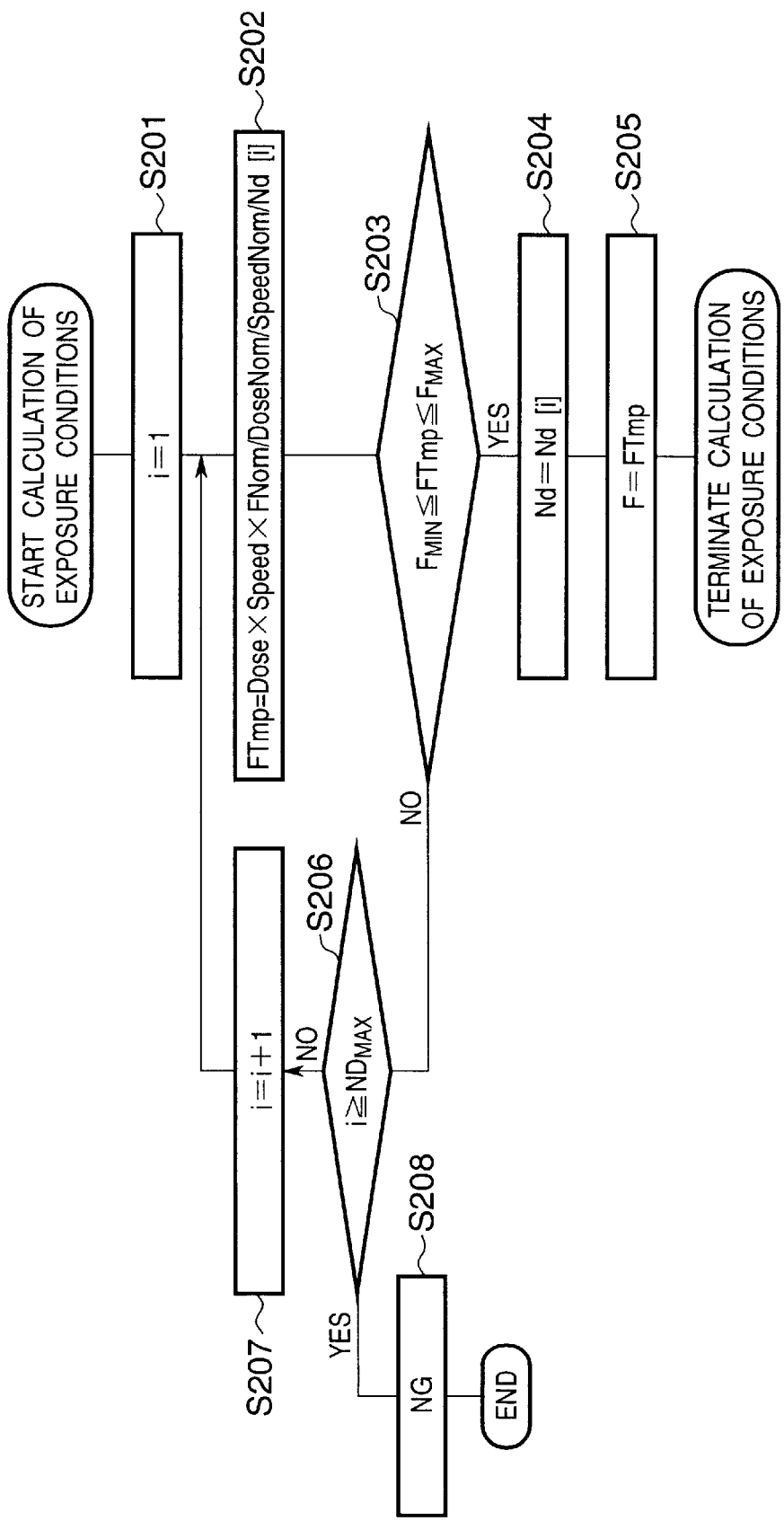
FIG. 5 is a flowchart showing the details of processing for computing exposure conditions in the processing of FIG. 2.

As for the target value of the amount of exposure, exposure conditions in respective areas are decided using the flowchart of FIG. 5 and an oscillation frequency is switched at the vacant space between the F and R patterns. When two illumination systems are used, the illumination system upon which the exposing light impinges is changed over at the vacant space between the F and R patterns. In the case of a single illumination system, the illumination itself is switched.

The main CPU applies an illumination-system changeover command, a wavelength-changeover command and a focus-target changeover command to an illumination-system drive unit, light source and stage.

An embodiment of the present invention will now be described with reference to the drawings.

FIG. 1 is a diagram showing the construction of a scanning-type multiple-exposure apparatus according to an embodiment of the present invention. As shown in FIG. 1, the apparatus includes an exposure light source 1, which is a pulsed light source such as a KrF excimer laser, a half-mirror 2, beam attenuation filters 3, 4, half-mirrors 5, 7, exposure sensors 6, 8, illumination optical systems 9, 10, a half-mirror 11, a beam splitter 12, a reticle 13 and a projection lens 14. A wafer is shown at 15.

Figure 2:
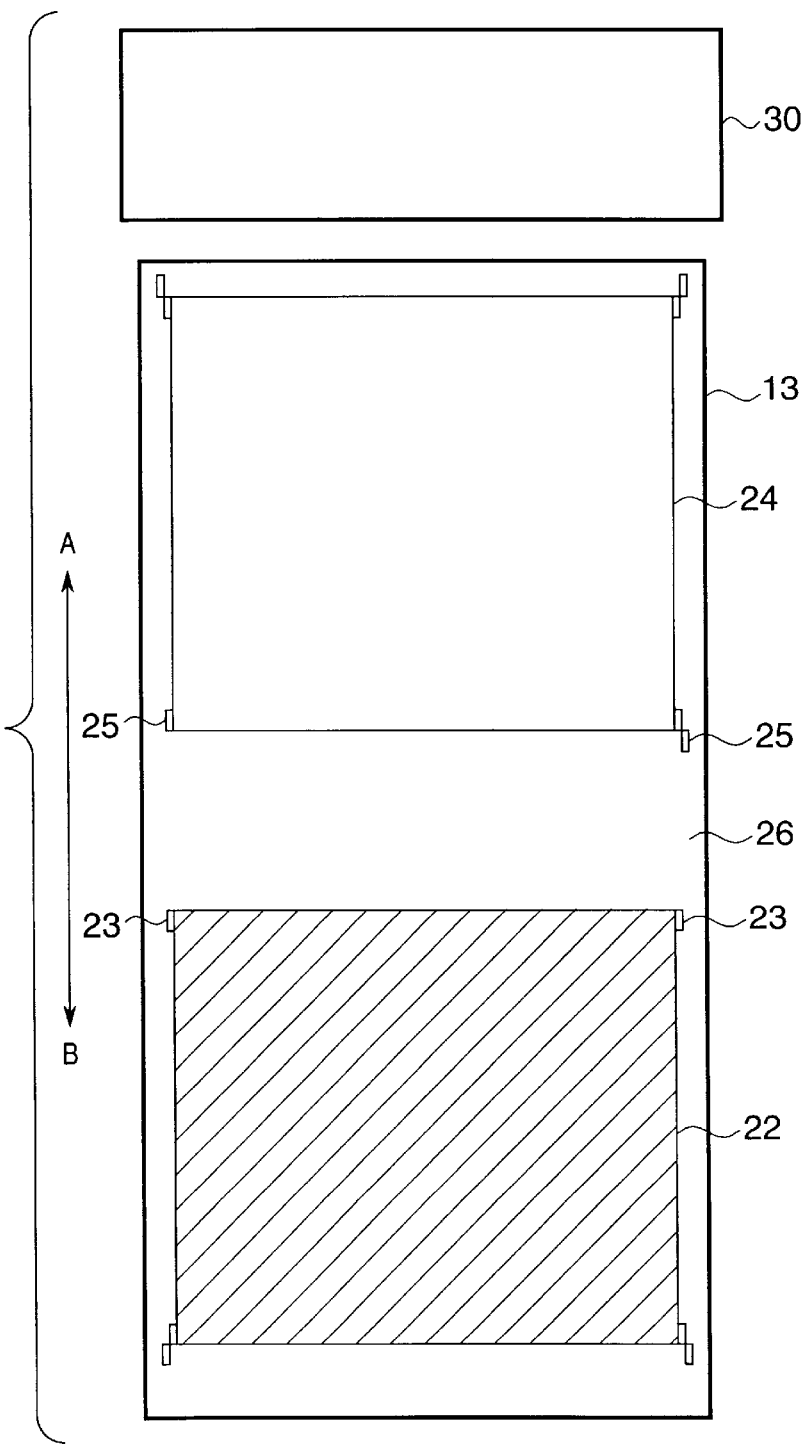
FIG. 2 is a diagram useful in describing a reticle used in the apparatus of FIG. 1.

FIG. 2 illustrates the construction of the reticle 13 in a case wherein a fine pattern having a minimum line width of 0.1 μm is transferred to the wafer using the exposure apparatus of FIG. 1. Numeral 22 denotes a phase-shift pattern (diffraction grating) (F pattern) of a so-called Levinson type or the like, and numeral 24 represents a real-element pattern (R pattern) similar to that of the prior art except for the fact that the minimum line width is a small 0.1 μm. Numerals 23 and 25 denote reticle marks for aligning the F pattern 22 and R pattern 24, respectively. These also serve as pattern-difference marks for sensing the difference between the patterns when scanning exposure is performed. A vacant space 26 is provided between the F pattern 22 and the R pattern 24. Numeral 30 schematically illustrates a slit-shaped beam.

With reference again to FIG. 1, the half-mirror 2 splits a beam emitted from the exposure light source 1 into two light beams. The light reflected by the half-mirror 2 impinges upon the illumination system 9 via the beam attenuation filter 3 and half-mirror 5. After illumination conditions (σ and quantity of light, etc.) are controlled by the illumination system 9, the light passes through the beam splitter 12 and illuminates the reticle 13. Meanwhile, the light that passes through the half-mirror 2 impinges upon the illumination system 10 via the beam attenuation filter 4 and half-mirror 7. After illumination conditions (σ and quantity of light, etc.) are controlled by the illumination system 10, the light is reflected by the beam splitter 12 and illuminates the reticle 13. In this case, by staggering the area illuminated by the illumination system 9 and the area illuminated by the illumination system 10 in the scanning direction, the R pattern 24 and the F pattern 22 can be exposed, by a single scan, on two shot areas neighboring each other across a vacant space of a scribe-line width on the wafer 15 using the reticle 13 having the vacant space 26, the width of which is greater than a scribe line, between a first pattern (e.g., the R pattern 24 of FIG. 2) and a second pattern (e.g., the F pattern 22 of FIG. 2).

The illumination system 9 is provided with a slit member for illuminating the R pattern 24 on the reticle 13 with slit-shaped light, and a shutter or movable blades for interrupting the slit-shaped illumination before the R pattern 24 arrives at the exposure field and after the R pattern 24 traverses the exposure field. Similarly, the illumination system 10 is provided with a slit member for illuminating the F pattern 22 on the reticle 13 with slit-shaped light, and a shutter or movable blades for interrupting the slit-shaped illumination before the F pattern 22 arrives at the exposure field and after the F pattern 22 traverses the exposure field. The illumination systems 9, 10 are further provided with diaphragm mechanisms for setting σ. The beam attenuation filters 3 and 5 are for setting the amounts of exposure of the first and second patterns, respectively. For example, each of these may comprise an ND filter of variable transmittance.

Figure 3:
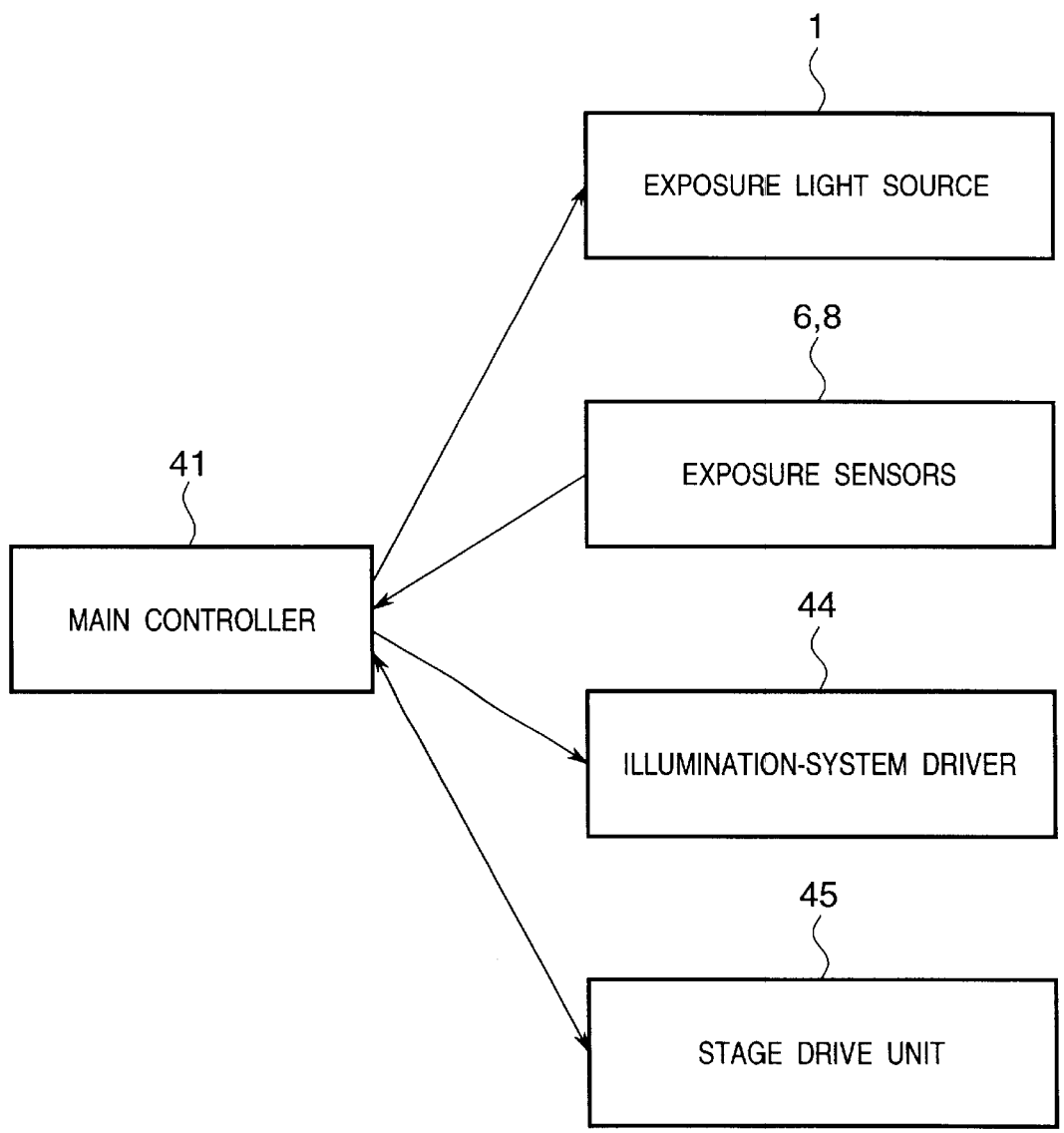
FIG. 3 is a block diagram of a control system in the apparatus of FIG. 1.

FIG. 3 illustrates the control system of the exposure apparatus of FIG. 1. As shown in FIG. 3, the control system has a main controller 41 for controlling operation of the kind illustrated in the flowcharts of FIGS. 4 and 5. For example, on the basis of outputs from the exposure sensors 6, 8, the main controller 41 drives the beam attenuation filters 3, 5 via an illumination-system driver 44 and controls the laser oscillation frequency of the exposure light source 1 to set the amount of exposure. The main controller 41 drives the above-mentioned diaphragm mechanism to set σ as well. Furthermore, the main controller 41 drives a reticle stage and wafer stage via a stage drive unit 45 to effect step movement from one exposure position to another, positioning in X, Y and θ directions at this exposure position, tilt and focus control and scanning for exposure. In the apparatus of FIG. 1, the reticle 13 is mounted on the reticle stage, the wafer 15 is mounted on the wafer stage, and the reticle (i.e., the reticle stage) 13 and the wafer (i.e., the wafer stage) 15 are scanned past the object plane and image plane of the projection lens 14 synchronously in mutually opposing directions at a velocity ratio commensurate with the magnification of the projection lens 14, whereby the wafer 15 is exposed to the pattern image of the reticle 13.

The operation of the exposure apparatus shown in FIG. 1 will now be described with reference to FIGS. 4 and 5.

In the exposure apparatus of FIG. 1, exposure conditions such as exposure arrangement, exposure areas, NA, σ, amount of exposure and reticle transmittance, and alignment conditions such as alignment illumination mode, alignment position and alignment marks are read out of a storage device (not shown) such as a hard disk and stored in storage means (e.g., a RAM) in the main controller 41 that controls the operation of this exposure apparatus. The reticle 13 is placed on the reticle stage, the reticle is subjected to a correction in the traveling direction, then reticle offsets (pattern error between the R pattern 24 and F pattern 22, x, y and θ components) are measured from reticle marks 25 of the R pattern 24 and the reticle marks 23 of the F pattern 22, and these are stored in the above-mentioned storage means. When the wafer 15 serving as the substrate to be exposed has been loaded, global alignment measurement is performed automatically using the reticle marks 25 of the R pattern 24 and wafer marks (not shown) formed on the wafer 15, global alignment measurement is performed automatically in a similar fashion using the reticle marks 23 of the F pattern 22 and the aforesaid wafer marks, and focus measurement is carried out using focus measurement means, not shown. Offsets such as focus offset, leveling offset and alignment offsets (wafer shift, wafer rotation, wafer magnification, chip shift, chip rotation and chip magnification) are calculated from the results of measurement and these offsets also are stored in the storage means of the control unit. Exposure information to be set, such as σ, slit shape and blade position for demarcating the exposure patterns, is set in the illumination systems 9 and 10. Also set is exposure information common to both patterns on the reticle 13.

Stepping movement is effected to the desired shot area and exposure processing is started with regard to this shot area and the shot area adjacent thereto. As shown in the flowchart of FIG. 4, focus offset, alignment offset and amount of exposure relating to the R pattern 24 on reticle 13 are read out of the storage means (step S101). If an amount of focus fluctuation is equal to or greater than a predetermined stipulated value ("YES" at step S102), the z stage (not shown) is actuated to bring the wafer into focus (step S105). If the amount of focus fluctuation is less than the stipulated value ("NO" at step S102), the exposure wavelength for bringing the wafer 15 into focus is calculated and the wavelength of the exposure light source 1 is set to this calculated value (step 103). Compensation is made for magnification owing to the changed wavelength (step S104). Scanning exposure conditions are then decided (step S106).

A case in which use is made of discrete-type beam attenuation means as the beam attenuation filters 3, 4 for changing over transmittance in a discrete fashion will be described. The discrete-type beam attenuation means used includes a plurality of ND filters of mutually different transmittances arranged on a disk which, by being rotated, successively changes over the ND filters situated in the optical path of illumination. Before this processing is executed, an amount of exposure (nominal exposure DoseNom) under conditions of no ND filtering (or ND filter transmittance of 100%), nominal oscillation frequency FNom and nominal scanning speed SpeedNom of each illumination system are calculated.

Figure 6:
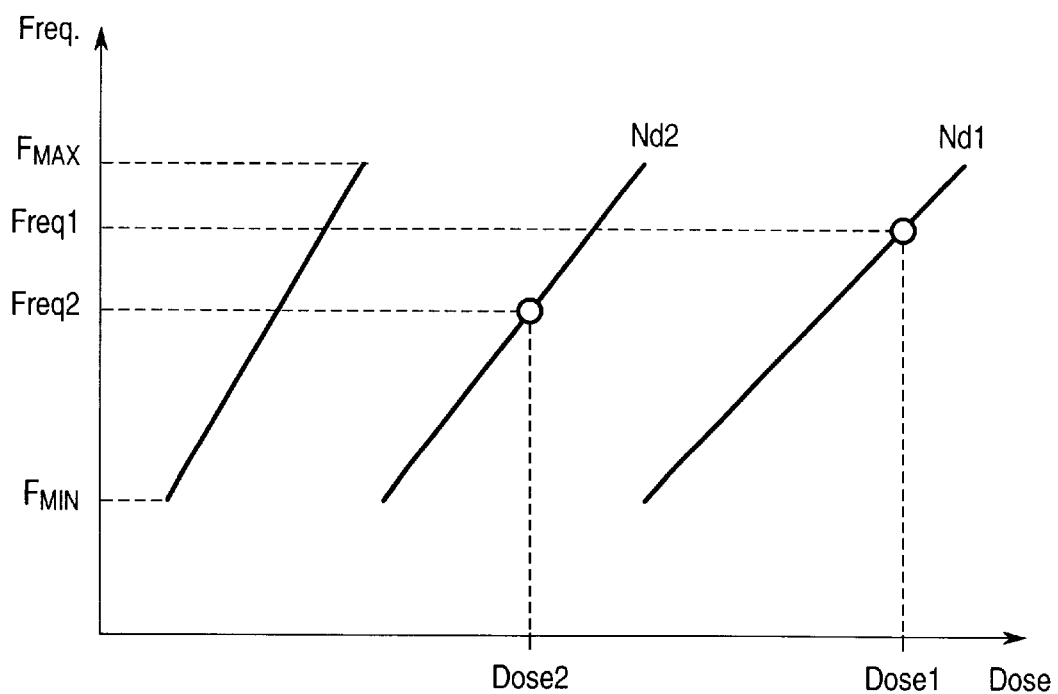
FIG. 6 is a graph showing an example of exposure conditions computed by the processing of FIG. 5.

With scanning exposure using a pulsed light source, oscillation frequency and quantity are proportionally related on the assumption that scanning velocity "Speed" and quantity of light per pulse of the pulsed light source are constant. Furthermore, if the output of the pulsed light source is varied in a discrete fashion by beam attenuation means (ND filters, etc.), the relationship between oscillation frequency and amount of exposure becomes as shown in FIG. 6. The amount of exposure (Dose) is plotted along the horizontal axis of FIG. 6, and oscillation frequency (Freq) of the pulsed light source is plotted along the vertical axis. It will be appreciated that Dose and Freq are proportionally related. If the oscillation frequency of the pulsed light source is reduced, the amount of exposure decreases in proportion thereto. In regard to oscillation frequency, an upper limit value FMAX, which is based upon the maximum frequency of the light emission, is decided as the rated value of the light source. Further, a minimum frequency FMIN of the light emission, which takes non-uniformity of the light emission into consideration, is decided based upon the design. Consequently, if the amount of exposure varies and the oscillation frequency keeps on being changed, the upper or lower limit, namely, the maximum frequency $F_{MAX}$ or minimum frequency $F_{MIN}$, is eventually reached. In such a case, the transmittance of the beam attenuation means is changed over to increase or decrease the quantity of light per pulse of the pulsed light source and to effect a change to the neighboring proportional straight line.

In the processing of FIG. 5 for calculating exposure conditions, oscillation frequency FTemp =(Dose×Speed×FNom)/(DoseNom×SpeedNom×Nd[i]) for carrying out optimum exposure using an ND filter of transmittance Nd[i] is calculated in regard to the first illumination system 9 (steps S201, S202). Here Dose, Speed, FNom, DoseNom, SpeedNom and Nd[i] represent amount of exposure, scanning speed, nominal oscillation frequency, nominal amount of exposure, nominal scanning speed and transmittance of an ith ND filter, respectively. Calculation of exposure conditions is performed in order starting from the 1st ND filter. If the calculated FTemp is equal to or greater than the minimum oscillation frequency $F_{MIN}$ and equal to or less than the maximum oscillation frequency $F_{MAX}$ ("YES" at step S203), FTemp is decided as the calculated value (Freq1) of the oscillation frequency of the first illumination system and the number Nd1 of the ND filter used with this illumination system is decided on as the number i prevailing at this time (steps S204, S205). Processing for calculating exposure conditions is then terminated. The white circle in FIG. 6 indicates an example of values of Freq1 and Nd1 decided. If FTemp is less than the minimum oscillation frequency $F_{MIN}$ or greater than the maximum oscillation frequency $F_{MAX}$ ("NO" at step S203), i is incremented (step S207) and calculation of the oscillation frequency FTemp and comparison of the calculated value FTemp with $F_{MAX}$ and $F_{MIN}$ in a case wherein light is attenuated by the next ND filter are repeated. If the calculated value FTemp does not fall within the range where it is equal to or greater than the minimum oscillation frequency $F_{MIN}$ and equal to or less than the maximum oscillation frequency $F_{MAX}$ even in regard to the final (i=$ND_{MAX}$) ND filter ("YES" at step S206), this means that there is no appropriate oscillation frequency. Accordingly, an "NG" decision is rendered (step S208) and processing for calculating exposure conditions is terminated.

Figure 4:
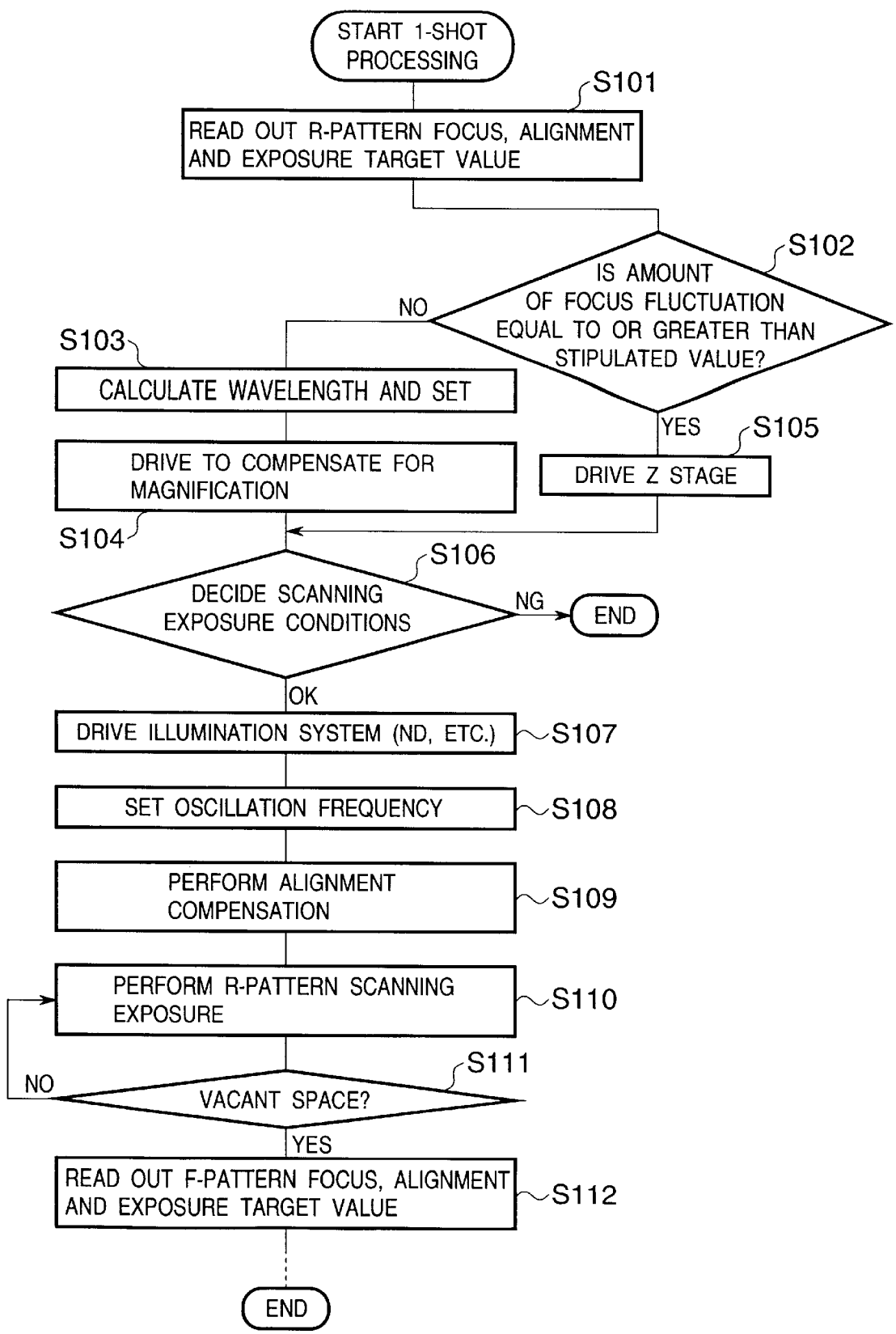
FIG. 4 is a flowchart illustrating processing for setting exposure in the apparatus of FIG. 1.

If, as a result of the above-described calculation of exposure conditions, the calculation of the oscillation frequency of illumination system 9 results in "NG", NG error processing such as generation of an alarm tone is executed and processing for setting exposure conditions is terminated in FIG. 4. If oscillation frequency Freq1 and the ND filter number Nd1 of illumination system 9 have been calculated, then the beam attenuation filter 3 of illumination system 9 is set as the ND filter of number Nd1 and the oscillation frequency of exposure light source 1 is set to Freq1 via the illumination-system driver 44 (steps S107, S108). Furthermore, the stage 45 is driven to effect alignment compensation, after which scanning exposure is carried out (steps S109, S110).

The positions of the reticle marks of reticle 13 are monitored during scanning exposure. If the reticle mark 25 passes by the slit 30, exposure of the R pattern 24 ends, and it is judged that the scanning position has reached the vacant space 26 between the patterns ("YES" at step S111). Then, the focus offset, alignment offset and amount of exposure relating to the F pattern 22 on reticle 13 are read out and, in a manner similar to that performed for the R pattern 24, focus compensation, deciding and setting of exposure conditions, alignment compensation and scanning exposure of the F pattern 22 are carried out (step S112).

Figure 7:
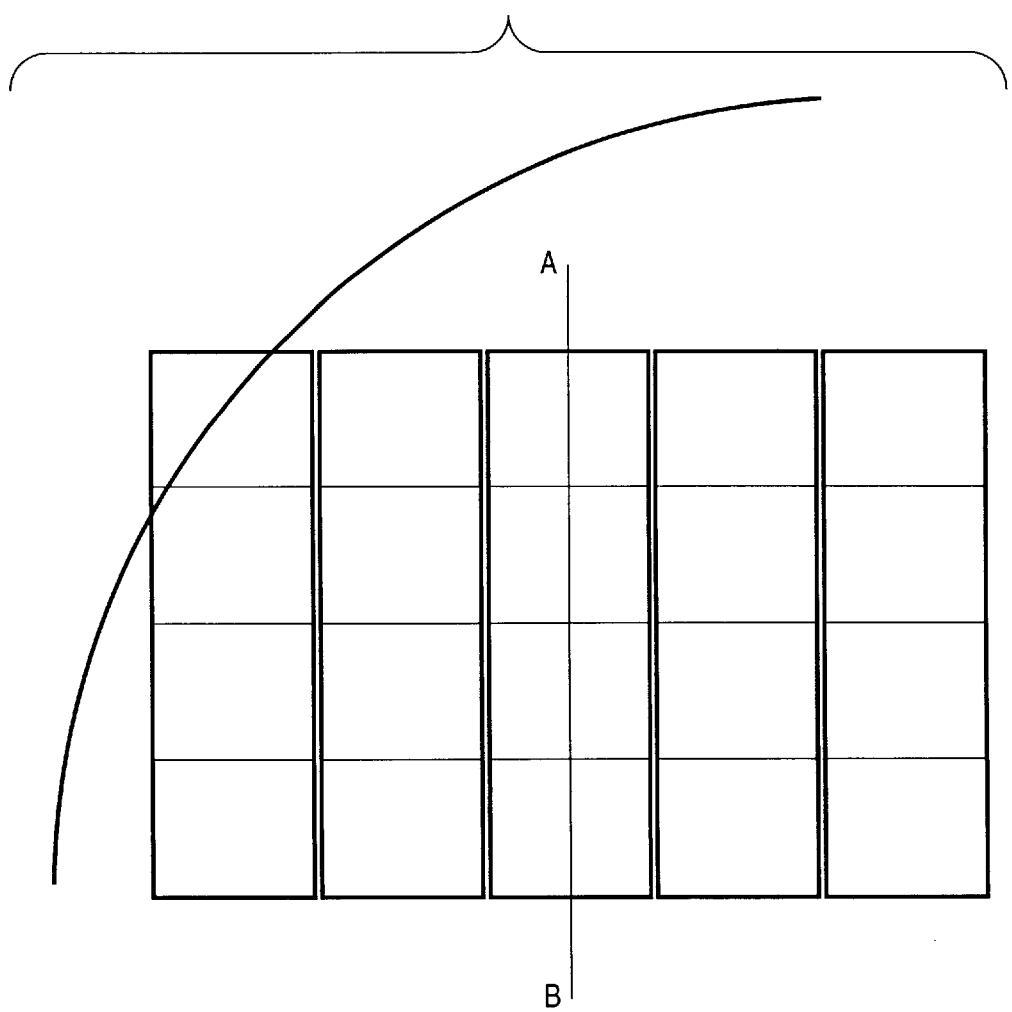
FIG. 7 is a diagram illustrating a state of wafer exposure by the apparatus of FIG. 1.
Figure 7:
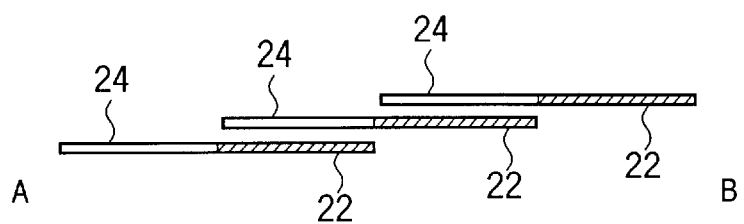

As a result, the R pattern 24 is transferred to one of the two mutually adjacent shot areas on the wafer 15 and the F pattern 22 is transferred to the other shot area by a single scan. Accordingly, by performing a number of scans the same as the number of shot areas while effecting stepping movement equivalent to one shot area in the scanning direction for every single scan, shot areas with the exception of those at both ends of the wafer 15 in the scanning direction thereof can be doubly exposed to the F pattern 22 and R pattern 24, as shown in FIG. 7. FIG. 7 illustrates a case wherein scanning is performed from A to B.

Thus, in accordance with this embodiment, when different patterns are printed, printing is carried out upon changing the target value taking into consideration a difference in focus and a difference in amount of exposure. A plurality of patterns are printed simultaneously using a plurality of illumination systems. This makes it possible to improve exposure performance and to raise throughput.

The illustrated embodiment is particularly effective in a case wherein the exposure conditions of the R pattern 24 and F pattern 22 differ. If the R pattern 24 and F pattern 22 are identical, the embodiment is useful in raising throughput even if it is applied to a case wherein identical patterns are exposed. In such a case where identical patterns are exposed, all shot areas can be exposed to patterns on a reticle by a number of scans equal to approximately half the number of shot areas if scanning is carried out while effecting stepping movement equivalent to two shot areas in the scanning direction for every single scan.

[Embodiment of device production process]

Described next will be an embodiment of a process for producing a device utilizing the projection exposure apparatus or method set forth above.

Figure 8:
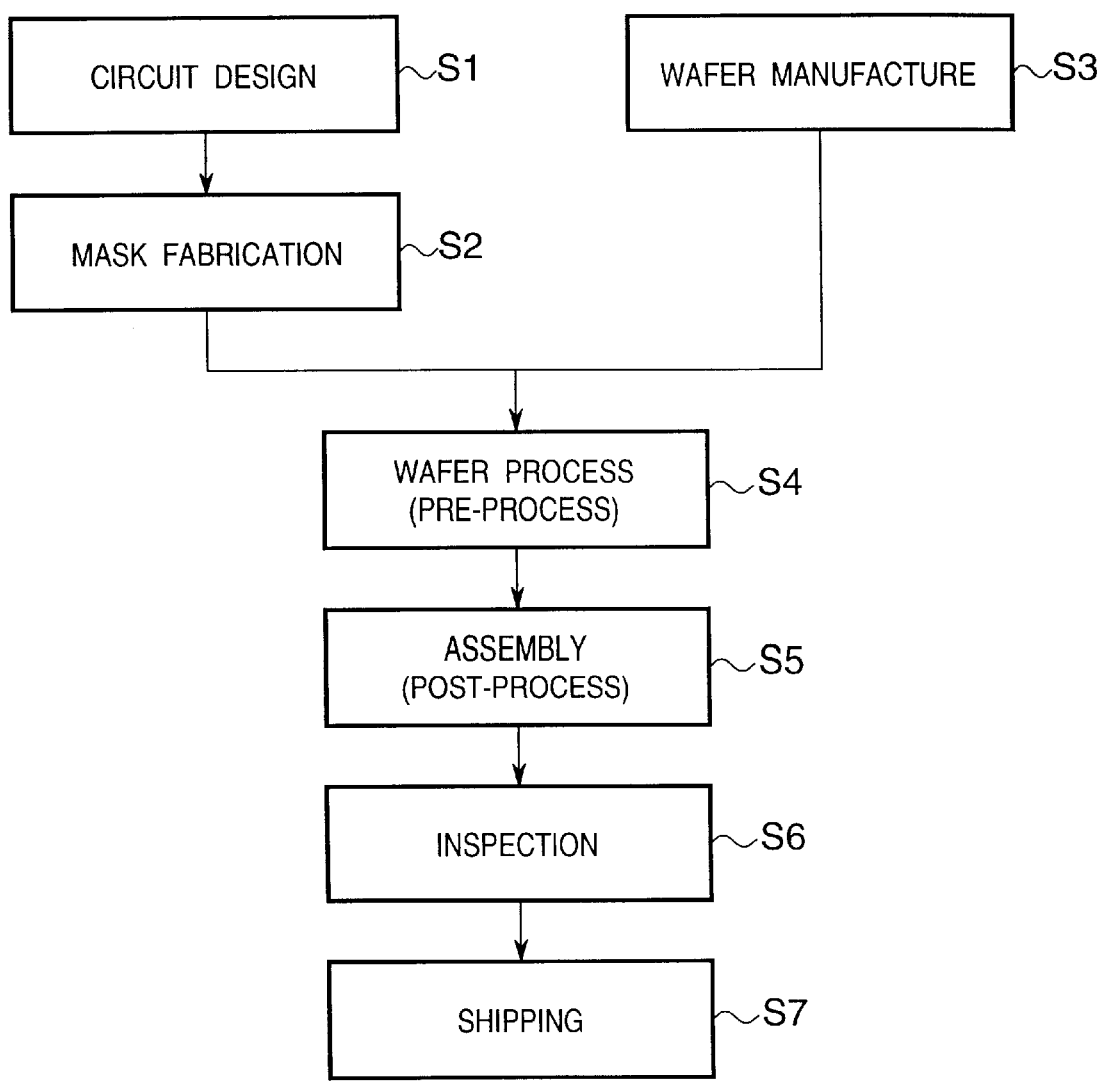
FIG. 8 is a flowchart illustrating the flow of manufacture of a microdevice.

FIG. 8 illustrates the flow of manufacture of a microdevice (a semiconductor chip such as an IC or LSI chip, a liquid crystal panel, a CCD, a thin-film magnetic head, a micromachine, etc.). The pattern for the device is designed at step S1 (circuit design). A mask on which the designed circuit pattern has been formed is fabricated at step S2 (mask fabrication). Meanwhile, a wafer is manufactured using a material such as silicon or glass at step S3 (wafer manufacture). The actual circuit is formed on the wafer by lithography, using the mask and wafer that have been prepared, at step S4 (wafer process), which is also referred to as a "pre-process". A semiconductor chip is obtained, using the wafer fabricated at step S4, at step S5 (assembly), which is also referred to as a "post-process". This step includes steps such as actual assembly (dicing and bonding) and packaging (chip encapsulation). The semiconductor device fabricated at step S5 is subjected to inspections such as an operation verification test and a durability test at step S6 (inspection). The semiconductor device is completed through these steps and then is shipped (step S7).

Figure 9:
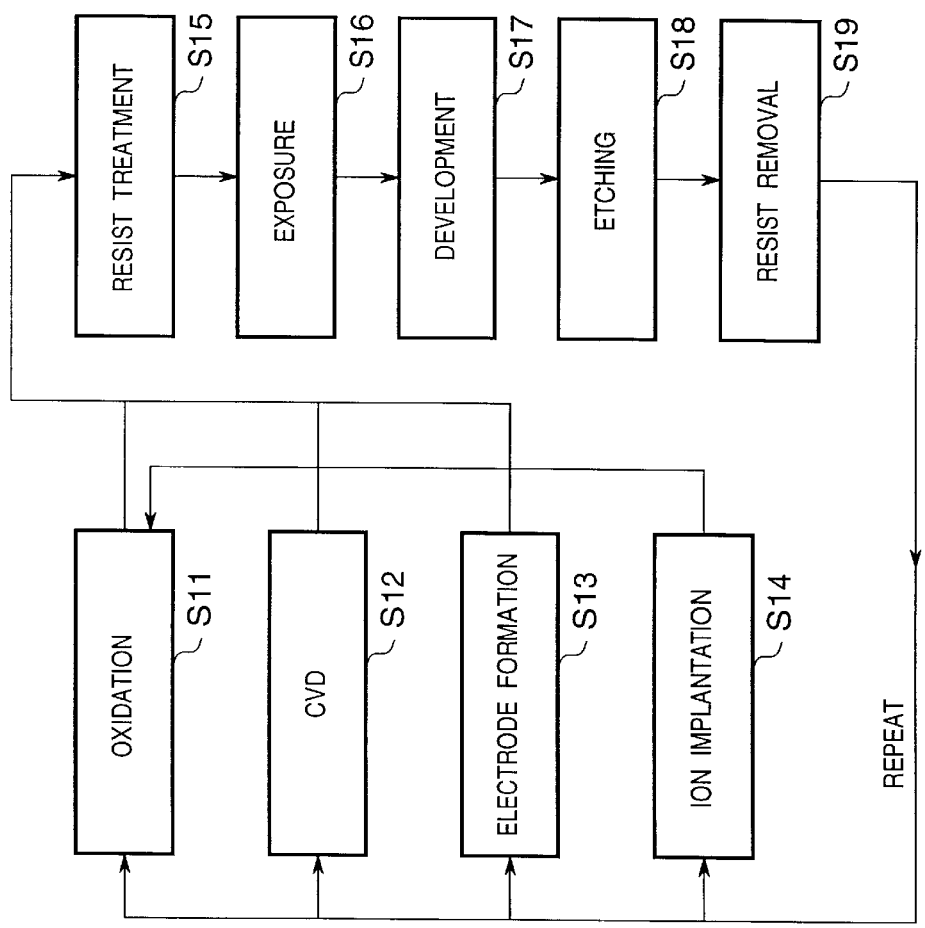
FIG. 9 is a flowchart illustrating the detailed flow of a wafer process in FIG. 8.

FIG. 9 is a flowchart illustrating the detailed flow of the wafer process mentioned above. The surface of the wafer is oxidized at step S11 (oxidation). An insulating film is formed on the wafer surface at step S12 (CVD), electrodes are formed on the wafer by vapor deposition at step S13 (electrode formation), and ions are implanted in the wafer at step S14 (ion implantation). The wafer is coated with a photoresist at step S15 (resist treatment), the wafer is exposed to the circuit pattern of the mask to print the pattern onto the wafer by the above-described projection exposure apparatus at step S16 (exposure), and the exposed wafer is developed at step S17 (development). Portions other than the developed photoresist are etched away at step S18 (etching), and any unnecessary resist left after etching is performed is removed at step S19 (resist removal). Multiple circuit patterns are formed on the wafer by implementing these steps repeatedly.

If the production process of this embodiment is employed, semiconductor devices having a high degree of integration can be manufactured at low cost. The Manufacture of such semiconductor devices using the prior-art techniques was difficult.

Thus, in accordance with the embodiment described above, a plurality of patterns are disposed on a single reticle in the direction of scanning, and focus and exposure conditions are set for each individual pattern. This makes it possible to raise throughput and improve exposure performance.

As many apparently widely different embodiments of the present invention can be made without departing from the spirit and scope thereof, it is to be understood that the invention is not limited to the specific embodiments thereof except as defined in the appended claims.

What is claimed is:

1. A method of exposing a substrate to a pattern of a reticle by synchronously scanning the reticle and the substrate in a direction relative to a slit-shaped illumination area which is formed on the reticle, said method comprising steps of:
   providing a reticle on which first and second patterns are formed along the direction; and
   exposing a substrate to the first and second patterns of the reticle under different σ's in one scanning process.

2. The method according to claim 1, further comprising a step of illuminating the first and second patterns by respective ones of a plurality of illumination systems in which light beams, which have been obtained by splitting a beam emitted from a single exposure light source, are set to respective ones of desired σ's, thereby automatically changing over the σ's in dependence upon a changeover of the first and second patterns subjected to slit-shaped illumination.

3. The method according to claim 1, wherein a vacant space between the first and second patterns on the reticle is made broader than an ordinary scribe line.

4. The method according to claim 1, further comprising a step of partially overlapping scanning exposure zones and repeating exposure, whereby the first and second patterns are projected onto the same exposure position of the substrate in superimposed form to thereby expose the substrate to the patterns at this position.

5. A scanning-type projection exposure apparatus for exposing a substrate to a pattern of a reticle by synchronously scanning the reticle and the substrate in a direction relative to a slit-shaped illumination area which is formed on the reticle, the reticle including first and second patterns formed along the direction, said apparatus comprising:
   an exposure device which exposes the substrate to the first and second patterns of the reticle under different σ's in one scanning process.

6. A scanning-type projection exposure apparatus for exposing a substrate to a pattern of a reticle by synchronously scanning the reticle and the substrate in a direction relative to a slit-shaped illumination area which is formed on the reticle, the reticle including first and second patterns formed along the direction, said apparatus comprising:
   a single exposure light source for emitting a beam;
   splitting means for splitting the beam emitted from said exposure light source into split light beams;
   a plurality of illumination systems in which the split light beams obtained from said splitting means are set to respective ones of desired illumination conditions for illuminating respective ones of the first and second patterns, in order to expose a substrate to the first and second patterns of the reticle under different illumination conditions in one scanning process; and
   means for changing over focus target values between the first and second patterns during the one scanning process.

7. The apparatus according to claim 5, wherein scanning exposure zones are partially overlapped and exposure is repeated, whereby the first and second patterns are projected onto the same exposure position of the substrate in superimposed form to thereby expose the substrate to the patterns at this position.

8. A method of manufacturing a device, wherein a device is manufactured using the exposure method described in claim 1.

9. A device manufactured by the method of manufacturing a device described in claim 8.

10. A method of exposing a substrate to a pattern of a reticle by synchronously scanning the reticle and the substrate in a direction relative to a slit-shaped illumination area which is formed on the reticle, said method comprising the steps of:
   providing a reticle on which first and second patterns are formed along the direction; and
   exposing a substrate to the first and second patterns of the reticle under different focus target values in one scanning process.

11. The apparatus according to claim 6, wherein scanning exposure zones are partially overlapped and exposure is repeated, whereby the first and second patterns are projected onto the same exposure position of the substrate in superimposed form to thereby expose the substrate to the patterns at this position.

12. A method of exposing a substrate to a pattern of a reticle by synchronously scanning the reticle and the substrate in a direction relative to a slit-shaped illumination area which is formed on the reticle, said method comprising the steps of:
   providing a reticle on which first and second patterns are formed along the direction; and
   exposing a substrate to the first and second patterns of the reticle under different exposure wavelengths in one scanning process.

13. A scanning-type projection exposure apparatus for exposing a substrate to a pattern of a reticle by synchronously scanning the reticle and the substrate in a direction relative to a slit-shaped illumination area which is formed on the reticle, the reticle including first and second patterns formed along the direction, said apparatus comprising:
   an exposure device which exposes the substrate to the first and second patterns of the reticle under different exposure wavelengths in one scanning process.

14. The apparatus according to claim 13, wherein scanning exposure zones are partially overlapped and exposure is repeated, whereby the first and second patterns are projected onto the same exposure position of the substrate in superimposed form to thereby expose the substrate to the patterns at this position.

15. A scanning-type projection exposure apparatus for exposing a substrate to a pattern of a reticle by synchronously scanning the reticle and the substrate in a direction relative to a slit-shaped illumination area which is formed on the reticle, the reticle including first and second patterns formed along the direction, said apparatus comprising:

an exposure device which exposes the substrate to the first and second patterns of the reticle under different focus target values in one scanning process.

16. The apparatus according to claim 15, wherein scanning exposure zones are partially overlapped and exposure is repeated, whereby the first and second patterns are projected onto the same exposure position of the substrate in superimposed form to thereby expose the substrate to the patterns at this position.

17. A scanning-type projection exposure apparatus for exposing a substrate to a pattern of a reticle by synchronously scanning the reticle and the substrate in a direction relative to a slit-shaped illumination area which is formed on the reticle, the reticle including first and second patterns formed along the direction, said apparatus comprising:

an exposure device which exposes the substrate to the first and second patterns of the reticle under different exposure amounts in one scanning process.

18. A scanning-type projection exposure apparatus for exposing a substrate to a pattern of a reticle by synchronously scanning the reticle and the substrate in a direction relative to a slit-shaped illumination area which is formed on the reticle, the reticle including first and second patterns formed along the direction, said apparatus comprising:

an exposure device which exposes the substrate to the first and second patterns of the reticle under different oscillation frequencies of a light source in one scanning process.

19. A scanning-type projection exposure apparatus for exposing a substrate to a pattern of a reticle by synchronously scanning the reticle and the substrate in a direction relative to a slit-shaped illumination area which is formed on the reticle, the reticle including first and second patterns formed along the direction, said apparatus comprising:

an exposure device which exposes the substrate to the first and second patterns of the reticle under different illumination conditions and different focus target values in one scanning process.

20. A scanning-type projection exposure apparatus for exposing a substrate to a pattern of a reticle by synchronously scanning the reticle and the substrate in a direction relative to a slit-shaped illumination area which is formed on the reticle, the reticle including first and second patterns formed along the direction, said apparatus comprising:

an exposure device which exposes the substrate to the first and second patterns of the reticle under different $\sigma$'s and different exposure amounts in one scanning process.

21. A method of manufacturing a device, comprising:

manufacturing a device using the exposure apparatus described in any one of claims 5, 6, 7, and 13 to 20.

22. A device manufactured by the method of manufacturing a device described in claim 21.

* * * * *

UNITED STATES PATENT AND TRADEMARK OFFICE
CERTIFICATE OF CORRECTION

PATENT NO. : 6,383,940 B1
DATED : May 7, 2002
INVENTOR(S) : Keiji Yoshimura

It is certified that error appears in the above-identified patent and that said Letters Patent is hereby corrected as shown below:

Column 5,
Line 47, "σas" should read -- σ as --.

Column 7,
Line 4, "FMAX" should read -- $F_{MAX}$ --.
Line 6, "FMIN" should read -- $F_{MIN}$ --.

Column 9,
Line 16, "Manufacture" should read -- manufacture --.

Signed and Sealed this

Twenty-second Day of October, 2002

Attest:

JAMES E. ROGAN
Attesting Officer          Director of the United States Patent and Trademark Office